United States Patent
Liu et al.

(10) Patent No.: US 10,163,785 B2
(45) Date of Patent: Dec. 25, 2018

(54) SEMICONDUCTOR DIE CONTACT STRUCTURE AND METHOD

(71) Applicant: Taiwan Semiconductor Manufacturing Company, Ltd., Hsin-Chu (TW)

(72) Inventors: Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/395,991

(22) Filed: Dec. 30, 2016

(65) Prior Publication Data

US 2017/0110424 A1 Apr. 20, 2017

Related U.S. Application Data

(60) Continuation of application No. 14/604,503, filed on Jan. 23, 2015, now Pat. No. 9,536,811, which is a (Continued)

(51) Int. Cl.
*H01L 23/528* (2006.01)
*H01L 23/485* (2006.01)
(Continued)

(52) U.S. Cl.
CPC ............ *H01L 23/528* (2013.01); *H01L 23/48* (2013.01); *H01L 23/481* (2013.01);
(Continued)

(58) Field of Classification Search
CPC ...... H01L 23/48; H01L 23/481; H01L 23/482; H01L 23/4824; H01L 23/485;
(Continued)

(56) References Cited

U.S. PATENT DOCUMENTS 5,943,597 A 8/1999 Kleffner et al.
6,218,281 B1 4/2001 Watanabe et al.
(Continued)

FOREIGN PATENT DOCUMENTS

CN 101504935 A 8/2009
JP H01187948 A 7/1989
(Continued)

OTHER PUBLICATIONS

Chen, Yu-Feng et al., "Design Scheme for Connector Site Spacing and Resulting Structures," U.S. Appl. No. 14/302,117, Taiwan Semiconductor Manufacturing Company, Ltd., filed Jun. 1, 2014, 31 pages.

*Primary Examiner* — Eduardo A Rodela
(74) *Attorney, Agent, or Firm* — Slater Matsil, LLP

(57) ABSTRACT

A system and method for forming a semiconductor die contact structure is disclosed. An embodiment comprises a top level metal contact, such as copper, with a thickness large enough to act as a buffer for underlying low-k, extremely low-k, or ultra low-k dielectric layers. A contact pad or post-passivation interconnect may be formed over the top level metal contact, and a copper pillar or solder bump may be formed to be in electrical connection with the top level metal contact.

20 Claims, 9 Drawing Sheets

Related U.S. Application Data division of application No. 12/846,214, filed on Jul. 29, 2010, now Pat. No. 9,024,431.

(60) Provisional application No. 61/256,187, filed on Oct. 29, 2009.

(51) Int. Cl.

| | | |
|---|---|---|
| *H01L 23/498* | (2006.01) | |
| *H01L 23/482* | (2006.01) | |
| *H01L 23/48* | (2006.01) | |
| *H01L 23/522* | (2006.01) | |
| *H01L 23/52* | (2006.01) | |
| *H01L 23/00* | (2006.01) | |
| *H01L 23/532* | (2006.01) | |

(52) U.S. Cl.
CPC .......... *H01L 23/482* (2013.01); *H01L 23/485* (2013.01); *H01L 23/4824* (2013.01); *H01L 23/49811* (2013.01); *H01L 23/49838* (2013.01); *H01L 23/52* (2013.01); *H01L 23/522* (2013.01); *H01L 23/5226* (2013.01); *H01L 23/5329* (2013.01); *H01L 24/05* (2013.01); *H01L 24/10* (2013.01); *H01L 24/11* (2013.01); *H01L 24/13* (2013.01); *H01L 23/53228* (2013.01); *H01L 2224/0225* (2013.01); *H01L 2224/0226* (2013.01); *H01L 2224/0401* (2013.01); *H01L 2224/05124* (2013.01); *H01L 2224/05147* (2013.01); *H01L 2224/05166* (2013.01); *H01L 2224/05171* (2013.01); *H01L 2224/05184* (2013.01); *H01L 2224/05644* (2013.01); *H01L 2224/05647* (2013.01); *H01L 2224/05655* (2013.01); *H01L 2224/05666* (2013.01); *H01L 2224/1147* (2013.01); *H01L 2224/11464* (2013.01); *H01L 2224/13* (2013.01); *H01L 2224/13018* (2013.01); *H01L 2224/13026* (2013.01); *H01L 2224/13082* (2013.01); *H01L 2224/13099* (2013.01); *H01L 2224/13147* (2013.01); *H01L 2224/13155* (2013.01); *H01L 2224/16* (2013.01); *H01L 2924/014* (2013.01); *H01L 2924/0105* (2013.01); *H01L 2924/01006* (2013.01); *H01L 2924/01013* (2013.01); *H01L 2924/01019* (2013.01); *H01L 2924/01022* (2013.01); *H01L 2924/01024* (2013.01); *H01L 2924/01029* (2013.01); *H01L 2924/01032* (2013.01); *H01L 2924/01033* (2013.01); *H01L 2924/01046* (2013.01); *H01L 2924/01047* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/07025* (2013.01); *H01L 2924/19041* (2013.01); *H01L 2924/35121* (2013.01)

(58) Field of Classification Search
CPC ... H01L 23/4855; H01L 23/52; H01L 23/522; H01L 23/5226; H01L 23/528
See application file for complete search history.

(56) References Cited

U.S. PATENT DOCUMENTS

| | | | |
|---|---|---|---|
| 6,229,220 B1 | 5/2001 | Saitoh et al. | |
| 6,469,370 B1 | 10/2002 | Kawahara et al. | |
| 6,578,754 B1 | 6/2003 | Tung | |
| 6,592,019 B2 | 7/2003 | Tung | |
| 6,693,361 B1 | 2/2004 | Siniaguine et al. | |
| 6,818,545 B2 | 11/2004 | Lee et al. | |
| 6,853,076 B2 | 2/2005 | Datta et al. | |
| 6,917,119 B2 | 7/2005 | Lee et al. | |
| 6,956,292 B2 | 10/2005 | Fan et al. | |
| 6,977,213 B1 | 12/2005 | Tsai et al. | |
| 7,064,436 B2 | 6/2006 | Ishiguri et al. | |
| 7,288,429 B2 | 10/2007 | Yaung et al. | |
| 7,312,535 B2 | 12/2007 | Takewaki et al. | |
| 7,348,673 B2 | 3/2008 | Kikuchi et al. | |
| 7,355,279 B2 * | 4/2008 | Ke | H01L 24/11 257/737 |
| 7,391,112 B2 | 6/2008 | Li et al. | |
| 7,397,121 B2 | 7/2008 | Chou et al. | |
| 7,569,475 B2 * | 8/2009 | Yang | H01L 21/76847 438/618 |
| 7,973,418 B2 | 7/2011 | Alvarado et al. | |
| 8,072,070 B2 | 12/2011 | Lee et al. | |
| 8,072,073 B2 | 12/2011 | Kikuchi et al. | |
| 8,198,133 B2 | 6/2012 | Daubenspeck et al. | |
| 8,288,871 B1 | 10/2012 | Shieh et al. | |
| 8,294,279 B2 | 10/2012 | Chen et al. | |
| 8,362,588 B2 | 1/2013 | Lee et al. | |
| 8,471,388 B2 | 6/2013 | Lin et al. | |
| 2001/0040290 A1 | 11/2001 | Sakurai et al. | |
| 2002/0132408 A1 * | 9/2002 | Ma | C09D 4/00 438/200 |
| 2005/0277283 A1 | 12/2005 | Lin et al. | |
| 2006/0220259 A1 | 10/2006 | Chen et al. | |
| 2006/0263727 A1 | 11/2006 | Lee et al. | |
| 2007/0045855 A1 | 3/2007 | Lo et al. | |
| 2007/0205520 A1 | 9/2007 | Chou et al. | |
| 2007/0232056 A1 | 10/2007 | Saitou et al. | |
| 2008/0150134 A1 * | 6/2008 | Shinkai | H01L 24/13 257/737 |
| 2008/0191366 A1 | 8/2008 | Hu et al. | |
| 2008/0308934 A1 | 12/2008 | Alvarado et al. | |
| 2009/0194889 A1 | 8/2009 | Jeng et al. | |
| 2010/0044860 A1 | 2/2010 | Haba et al. | |
| 2010/0187687 A1 | 7/2010 | Liu et al. | |
| 2010/0244263 A1 * | 9/2010 | Lin | H01L 23/5227 257/758 |
| 2011/0031581 A1 * | 2/2011 | West | H01L 23/481 257/508 |
| 2011/0037169 A1 | 2/2011 | Pagaila | |
| 2011/0095415 A1 | 4/2011 | Topacio et al. | |
| 2011/0121438 A1 | 5/2011 | Hart | |
| 2012/0049343 A1 | 3/2012 | Schulze et al. | |
| 2013/0062755 A1 | 3/2013 | Kuo et al. | |
| 2013/0147037 A1 | 6/2013 | Shen | |
| 2013/0320524 A1 | 12/2013 | Chuang et al. | |
| 2014/0291838 A1 | 10/2014 | Chen et al. | |
| 2016/0071812 A1 | 3/2016 | Chen et al. | |
| 2017/0047298 A1 | 2/2017 | Chen et al. | |

FOREIGN PATENT DOCUMENTS

| | | |
|---|---|---|
| JP | 5335313 A | 12/1993 |
| JP | 2000228420 A | 8/2000 |
| JP | 2001257226 A | 9/2001 |
| JP | 2002313994 A | 10/2002 |
| JP | 2004296621 A | 10/2004 |
| JP | 2006032600 A | 2/2006 |
| JP | 2007258438 A | 10/2007 |
| JP | 2007273624 A | 10/2007 |
| JP | 2008016514 A | 1/2008 |
| JP | 2008182059 A | 8/2008 |
| JP | 2009071045 A | 4/2009 |
| JP | 2009188288 A | 8/2009 |
| KR | 20110051136 A | 5/2011 |
| TW | 444298 B | 7/2001 |
| TW | 200901413 A | 1/2009 |

* cited by examiner

SEMICONDUCTOR DIE CONTACT STRUCTURE AND METHOD

This application is a continuation of U.S. patent Application Ser. No. 14/604,503, entitled, "Semiconductor Die Contact Structure and Method," filed on Jan. 23, 2015, which is a divisional of U.S. patent application Ser. No. 12/846,214, entitled "Semiconductor Die Contact Structure and Method," filed on Jul. 29, 2010, now U.S. Pat. No. 9,024,431, issued on May 5, 2015, which claims the benefit of U.S. Provisional Application No. 61/256,187, entitled "Semiconductor Die Contact Structure and Method," filed on Oct. 29, 2009, which applications are incorporated herein by reference.

TECHNICAL FIELD

The disclosure relates generally to semiconductor devices and, more particularly, to a system and method for forming contacts to a semiconductor die.

BACKGROUND

Generally, semiconductor dies comprise active devices, metallization layers forming connections to the active devices, and I/O contacts to provide the metallization layers (and active devices) signals and power. The metallization layers generally comprise a series of dielectric layers and metals layers in order to provide all of the required connections between the active devices and the I/O contacts (and between individual active devices). These dielectric layers may be formed from low-k dielectric materials with dielectric constants (k value) between about 2.9 and 3.8, ultra low-k (ULK) dielectric materials, with k values less than about 2.5, or even extra low-k (ELK) dielectric materials with k values between about 2.5 and about 2.9, or some combination of low-k dielectric materials.

However, while these low-k, ULK, and ELK materials may be used to improve the electrical characteristics of the metallization layers and thereby increase the overall speed or efficiency of the semiconductor device, these materials also have a major structural drawback. All of these materials have greater trouble than other dielectric materials handling the stresses applied to them in the semiconductor device. As such, the low-k, ULK, and ELK materials tend to delaminate or crack when too much pressure is applied to the low-K, ELK, and ULK materials. This delamination or cracking can damage or destroy a semiconductor device.

SUMMARY

In accordance with an embodiment, a semiconductor device comprises a substrate with a plurality of dielectric layers and conductive layers. A metal contact is in electrical connection with an uppermost one of the plurality of conductive layers, the metal contact having a thickness greater than about 15,000 Å. A connector is in electrical connection with the metal contact.

In accordance with another embodiment, a semiconductor device comprises a substrate with a plurality of metal layers. A metal contact is in electrical contact with the uppermost one of the plurality of metal layers, wherein the metal contact has a thickness greater than about 15,000 Å. A conductive pillar is in electrical contact with the metal contact.

In accordance with yet another embodiment, a method of manufacturing a semiconductor device comprises providing a substrate and forming a plurality of conductive layers and dielectric layer over the substrate, the dielectric layers located between the conductive layers. A passivation layer is formed over an uppermost one of the plurality of conductive layers. A metal contact is formed in the passivation layer and in connection with the uppermost one of the plurality of conductive layers, the metal contact having a thickness greater than about 15,000 Å. A conductive pillar is formed over the passivation layer, the conductive pillar electrically connected to the metal contact.

BRIEF DESCRIPTION OF THE DRAWINGS

For a more complete understanding of the disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

The disclosure will be described with respect to embodiments in a specific context, namely a conductive pillar structure. The disclosure may also be applied, however, to other contact structures.

Figure 1:
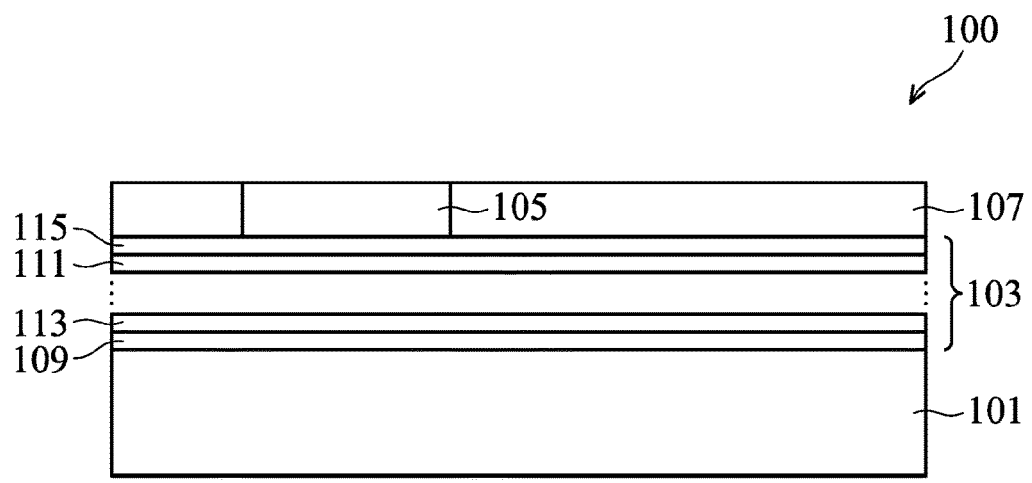
FIG. 1 illustrates a semiconductor die comprising a substrate, metallization layers, a first metal contact, and a first passivation layer in accordance with an embodiment.

With reference now to FIG. 1, there is shown a cross-sectional view of a wafer 100 comprising a substrate 101, metallization layers 103, a first metal contact 105, and a first passivation layer 107. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Various active devices (not shown) such as transistors, capacitors, resistors, and the like may be formed using any suitable methods either within or else on the surface of the substrate 101.

The metallization layers 103 are formed over the substrate 101 and are designed to connect the various active devices to form functional circuitry. The metallization layers 103 may be formed of alternating dielectric layers (e.g., first dielectric layer 109 and second dielectric layer 111) and conductive layers (e.g., first conductive layer 113 and uppermost second conductive layer 115) and may be formed through any suitable process (such as deposition, damascene, dual damascene, etc.). While there may be four layers alternating dielectric layer and conductive layers shown in FIG. 1, the precise number of dielectric layers and conductive layers located within the metallization layers 103 is dependent upon the overall design of the wafer 100, and may be larger or smaller than four layers (as indicated by the dashed line between the second dielectric layer 111 and the first conductive layer 113).

The dielectric layers (e.g., first dielectric layer 109 and second dielectric layer 111) of the metallization layers 103 may be formed, for example, of low-k dielectric materials with dielectric constants (k value) between about 2.9 and 3.8, ultra low-k (ULK) dielectric materials with k values less than about 2.5, extra low-k (ELK) dielectric materials with k values between about 2.5 and about 2.9, some combination of low-k dielectric materials, or the like. With the decrease in k values, the dielectric layers in the metallization layers 103 become more fragile and become subject to delamination and cracking.

The first passivation layer 107 may be formed over the uppermost conductive layer 115 and may comprise a dielectric material such as an oxide or silicon nitride, although other suitable dielectrics, such as a high-k dielectric, or any combination of these materials, may alternatively be used. The first passivation layer 107 may be formed using a plasma enhanced chemical vapor deposition (PECVD) process, although any other suitable process may alternatively be used. The first passivation layer 107 may have a thickness of between about 0.6 µm and about 1.4 µm, such as about 1 µm.

The first metal contact 105 is located in the first passivation layer 107. The first metal contact 105 serves as the contact between the uppermost conductive layer 115 and an exterior contact pad (described below with reference to FIG. 2). The first metal contact 105 may comprise a hard material such as copper, although other hard materials, such as tungsten, aluminum or copper alloy may alternatively be used. The first metal contact 105 may be formed using a damascene or dual damascene process which may include a copper overfill into an opening in the first passivation layer 107 followed by the removal of the excess copper through a process such as chemical mechanical polishing (CMP). However, any suitable material (such as, e.g., aluminum) and any suitable process (such as deposition and etching) may alternatively be used to form the first metal contact 105.

The first metal contact 105 may be formed to have a thickness that allows the first metal contact 105 to act as a buffer for the dielectric layers (e.g., first dielectric layer 109 and second dielectric layer 111) located in the metallization layers 103. As such, the first metal contact 105 may be formed to have a thickness of greater than about 15,000 Å, such as about 20,000 Å. By having the first metal contact 105 be made of a hard metal such as copper in this range of thicknesses, the first metal contact 105 can provide a better buffer for low-k dielectric layers, ELK dielectric layers, and/or ULK dielectric layers located in the metallization layers 103. This extra buffering allows more robust processing, transporting, and usage without the dielectric layers in the metallization layers 103 being damaged through, among other things, delamination or cracking.

Figure 2:
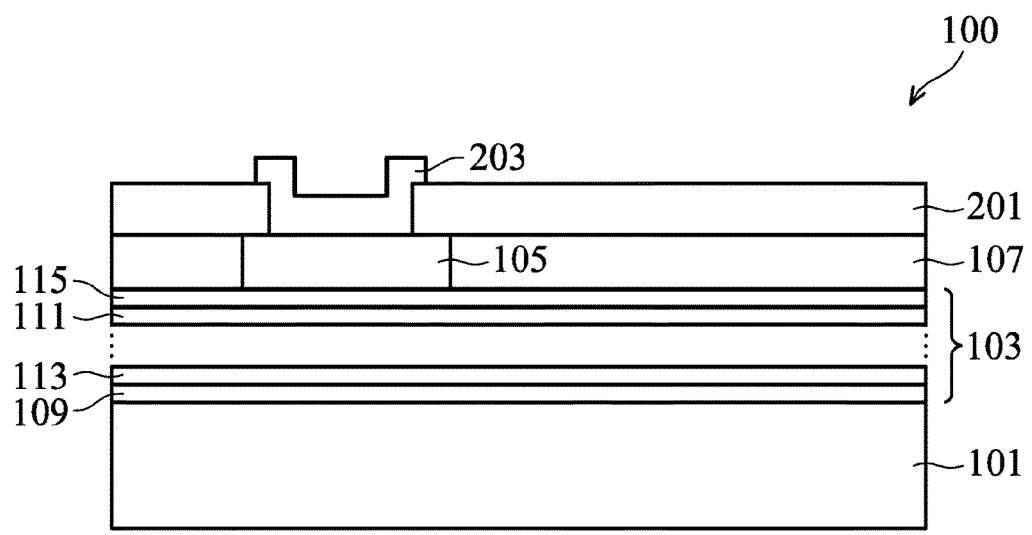
FIG. 2 illustrates the formation of a second passivation layer and a contact pad in accordance with an embodiment.

FIG. 2 illustrates the formation of a second passivation layer 201 and a contact pad 203. The second passivation layer 201 may be formed over the first passivation layer 107 and the first metal contact 105 so as to protect the first metal contact 105. The second passivation layer 201 may be formed in a similar fashion and from similar materials as the first passivation layer 107 discussed above with reference to FIG. 1, or, alternatively, the first passivation layer 107 and second passivation layer 201 may be formed from materials different from each other. Once formed, the second passivation layer 201 may be patterned through a suitable masking and removal process (such as a photolithographic mask and etching process) to allow for the formation of the contact pad 203 in electrical connection with the first metal contact 105.

The contact pad 203 provides a connection from the circuitry of the wafer 100 (including the active devices and the metallization layers 103), through the first metal contact 105, and to other devices (not shown) off the wafer 100. The contact pad 203 may be an aluminum/copper alloy and may be formed by forming an initial layer of the aluminum/copper alloy over the second passivation layer 201 and in electrical contact with the first metal contact 105. Once the initial layer of aluminum/copper alloy has been formed, a suitable technique such as photolithography and etching may then be used to pattern the aluminum/copper alloy to form the contact pad 203 as illustrated in FIG. 2. The contact pad 203 may be formed to have a thickness of between about 10,000 Å and about 50,000 Å, such as about 25,000 Å.

However, as one of skill in the art will realize, the above described process for forming the contact pad 203 is merely one material and method of formation. Other suitable materials may be utilized, including (but not limited to) aluminum, gold, silver, nickel, copper, tungsten, titanium, tantalum, compounds thereof, alloys thereof, multiple layers thereof, composites thereof, and combinations thereof, for example. Further, different materials may require different methods of formation, such as sputtering or even a dual damascene process. All of these materials and methods of formation may alternatively be used, and each is fully intended to be included within the scope of the present invention.

Figure 3:
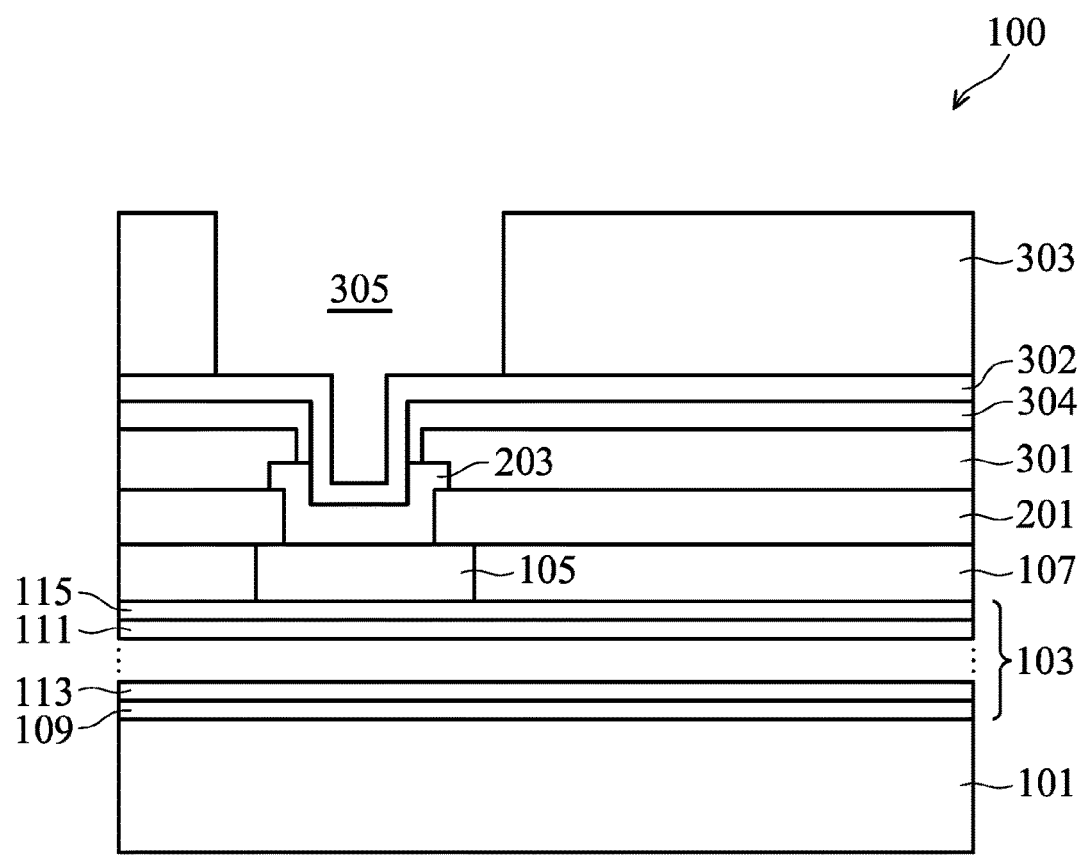
FIG. 3 illustrates the formation of a third passivation layer and a mask over the second passivation layer in accordance with an embodiment.

FIG. 3 illustrates the formation of a third passivation layer 301, an underbump metallization (UBM) 302, and a mask 303 over the second passivation layer 201. The third passivation layer 301 may be formed over the second passivation layer 201 and the contact pad 203 in order to protect the second passivation layer 201 and contact pad 203 from physical and environmental damage during subsequent processing and other environments the wafer 100 may encounter. The third passivation layer 301 may be formed of similar materials and through similar processes as the first passivation layer 107 and second passivation layer 201 (described above with reference to FIGS. 1 and 2, respectively), although the third passivation layer 301 may alternatively be formed of different materials than the first passivation layer 107 and the second passivation layer 201.

Once the third passivation layer 301 has been formed over the second passivation layer 201 and the contact pad 203, an opening may be formed through the third passivation layer 301 in order to expose a portion of the contact pad 203 for further connections. The opening may be formed through a suitable masking and removal process, such as a suitable photolithographic masking and etching process. The disclosed patterning process discussed, however, is merely intended as a representative process, and any other suitable patterning process may alternatively be utilized to expose a portion of the contact pad 203.

At this stage an optional polyimide (PI) coating 304 may be utilized to protect the third passivation layer 301. The PI coating 304 may be formed by coating the third passivation layer 301 with an insulating material, such as polyimide, polybenzoxazole (PBO), or epoxy, to a thickness of between about 2.5 µm and about 12 µm, such as about 4 µm. Alternatively, the PI coating 304 may be formed through either spraying a polyimide solution or by immersing the third passivation layer 301 into a polyimide solution. Any suitable method of formation may be utilized. The PI coating 304 may be patterned through a suitable masking and etching process to expose those portions of the contact pad 203 already exposed by the third passivation layer 301 in order to allow for connections to be made to the underlying contact pad 203.

Once the third passivation layer 301 has been patterned, the UBM 302 may be formed in contact with the contact pad 203. The UBM 302 may comprise a layer of a titanium and copper alloy. However, one of skill in the art will recognize that there are many suitable arrangements of materials and layers, such as an arrangement of titanium/copper/nickel, an arrangement of chrome/chrome-copper alloy/copper/gold, an arrangement of titanium/titanium tungsten/copper, or an arrangement of copper/nickel/gold, that are suitable for the formation of the UBM 302. Any suitable materials or layers of material that may be used for the UBM 302 are fully intended to be included within the scope of the current application.

The UBM 302 may be created by forming each layer conformally over the PI coating 304 and third passivation layer 301 and along the interior of the opening. The forming of each layer may be performed using a sputtering, CVD, or plating process, although other processes of formation, such as an evaporation or PECVD process, may alternatively be used depending upon the desired materials. The UBM 302 may be formed to have a thickness of between about 0.1 µm and about 2 µm, such as about 0.5 µm.

Once the third passivation layer 301, PI coating 304 and UBM 302 have been formed, the mask 303 may be formed over the UBM 302. In an embodiment, the mask 303 may be a dry film, which may include an organic material such as Ajinimoto buildup film (ABF). Alternatively, the mask 303 may be formed of a photoresist material. Once formed, the mask 303 may then be patterned to form a conductive pillar opening 305 to the UBM 302 over the contact pad 203.

In an embodiment, the conductive pillar opening 305 is formed to the desired size and shape of a subsequent conductive pillar 400 to be formed within the conductive pillar opening 305 (described below with respect to FIG. 4). The conductive pillar opening 305 may have a width of between about 10 µm and about 200 µm in width, such as about 80 µm, and a depth to the bottom surface of the third passivation layer 301 of between about 3,000 Å and about 60,000 Å, such as about 40,000 Å.

Figure 4:
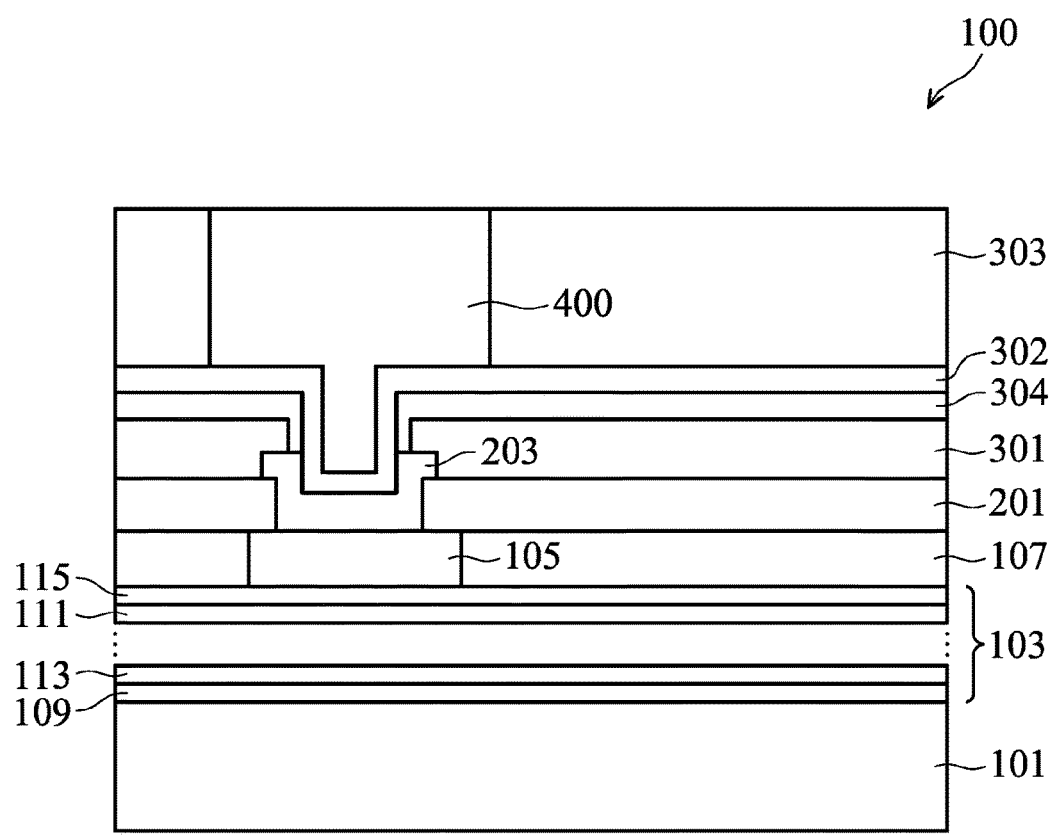
FIGS. 4-5 illustrate the formation of a conductive pillar in accordance with an embodiment.

FIG. 4 illustrates the selective filling of the conductive pillar opening 305 (see FIG. 3) with a conductive pillar 400. The conductive pillar 400 serves as an electrical connection between the contact pad 203 and devices of the wafer 100, thereby allowing signals and power to be routed to the metallization layers 103 and, eventually, to the active devices (not shown) located on the substrate 101.

The conductive pillar 400 may be formed in contact with the underlying UBM 302, and may be formed from a conductive material. In an embodiment, the conductive material may include metals such as copper or copper alloys, although other metals, such as aluminum, silver, gold, combinations thereof, and the like, may also be used. Conductive pillar 400 may be formed through a suitable process such as electrical plating, and may have a thickness less than about 60 µm, or even between about 30 µm and about 50 µm. Once the conductive pillar 400 has been formed, an optional conductive barrier layer (not shown), formed from, e.g., a nickel-containing layer, a copper-containing layer or a tin-containing layer, may be formed over the conductive pillar 400.

Figure 5:
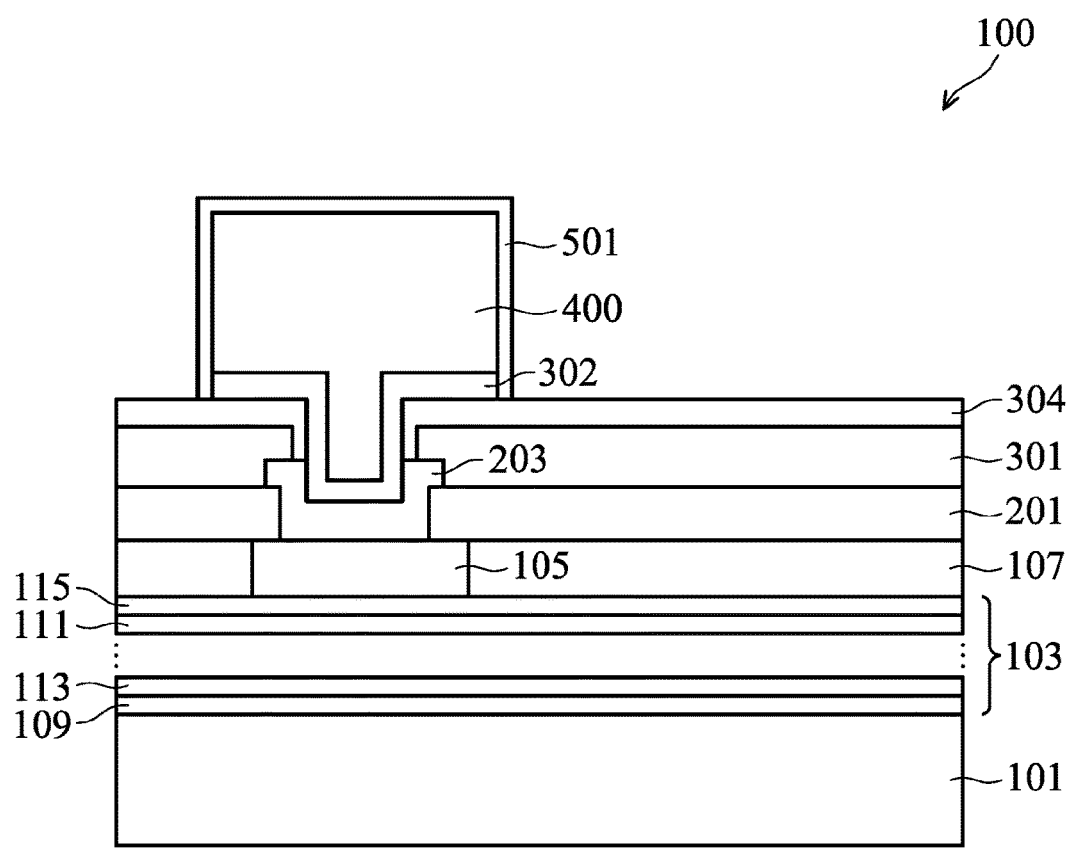

Next, as shown in FIG. 5, the mask 303 (see FIGS. 3 and 4) is removed using a suitable removal process, the UBM 302 is patterned, and a protective layer 501 is formed over the conductive pillar 400. The removal of the mask 303 leaves behind the conductive pillar 400, in the shape of the conductive pillar opening 305 (see FIG. 3). Once the mask 303 has been removed, portions of the UBM 302 may be removed through a suitable photolithographic masking and etching process to remove the undesired material and to leave the UBM 302 as a connection between the metal contact 203 and the conductive pillar 400.

After the mask 303 has been removed and the UBM 302 has been patterned, the protective layer 501 may be formed along the sidewalls of the conductive pillar 400. The protective layer 501 covers and protects the underlying conductive pillar 400 from environmental or physical damage during subsequent processing or usage. The protective layer 501 may be formed from tin, and may be applied to the sidewalls using an immersion plating process to a thickness of between about 500 Å and about 5,000 Å, such as about 2,000 Å. However, these materials and processes are meant to be exemplary only, as other suitable methods and materials may alternatively be used. For example, the protective layer 501 may be formed of a nickel palladium alloy through a process such as electroless palladium immersion gold (ENEPIG), or simply through an electroless nickel immersion gold (ENIG) process.

Figure 6:
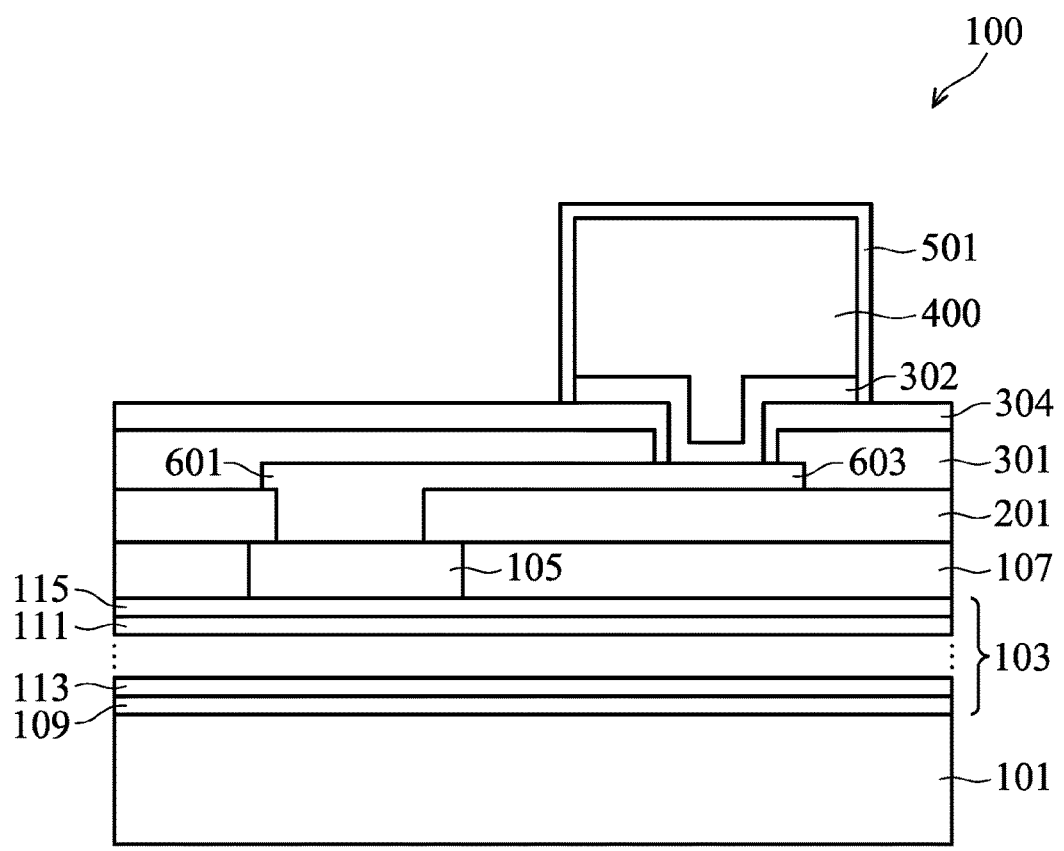
FIG. 6 illustrates the formation of a post-passivation interconnect structure in accordance with an embodiment.

FIG. 6 illustrates another embodiment in which the contact pad 203 (see FIG. 5) is replaced with a post-passivation interconnect (PPI) structure 601 that extends along the second passivation layer 201. The PPI 601 allows the conductive pillar 400 to be electrically connected to the first metal contact 105 to be placed in any desired location on the wafer 100, instead of limiting the location of the conductive pillar 400 to the region directly over the first metal contact 105.

In this embodiment the PPI 601 is formed by initially forming a seed layer (not shown) of a titanium copper alloy through a suitable formation process such as CVD or sputtering. A photoresist (not shown) is formed to cover the seed layer, and the photoresist is then patterned to expose those portions of the seed layer that are located where the PPI 601 is desired to be located.

Once the photoresist is formed and patterned, a conductive material 603, such as copper, may be formed on the seed layer through a deposition process such as plating. The conductive material 603 may be formed to have a thickness of between about 1 µm and about 10 µm, such as about 5 µm. However, while the material and methods discussed are suitable to form the conductive material 603, these materials are merely exemplary. Any other suitable materials, such as AlCu or Au, and any other suitable processes of formation, such as CVD or PVD, may alternatively be used to form the conductive material 603.

Once the conductive material 603 has been formed, the photoresist may be removed through a suitable removal process. Additionally, after the removal of the photoresist, those portions of the seed layer that were covered by the photoresist are removed through, for example, a suitable etch process using the conductive material 603 as a mask.

After the removal of the seed layer, the third passivation layer 301, the PI coating 304, the UBM 302, the conductive pillar 400, and the protective layer 501 may be formed over any desired portion of the PPI 601 while remaining in contact with the first metal contact 105. In this embodiment, the third passivation layer 301, the PI coating 304, the UBM 302, the conductive pillar 400, and the protective layer 501 may be formed through any suitable process such as the ones described above with reference to FIGS. 3-6. However, the use of the PPI 601 allows the conductive pillar 400 to be placed at any location desired for reasons such as optimization, placement, or any other reason.

Figure 7:
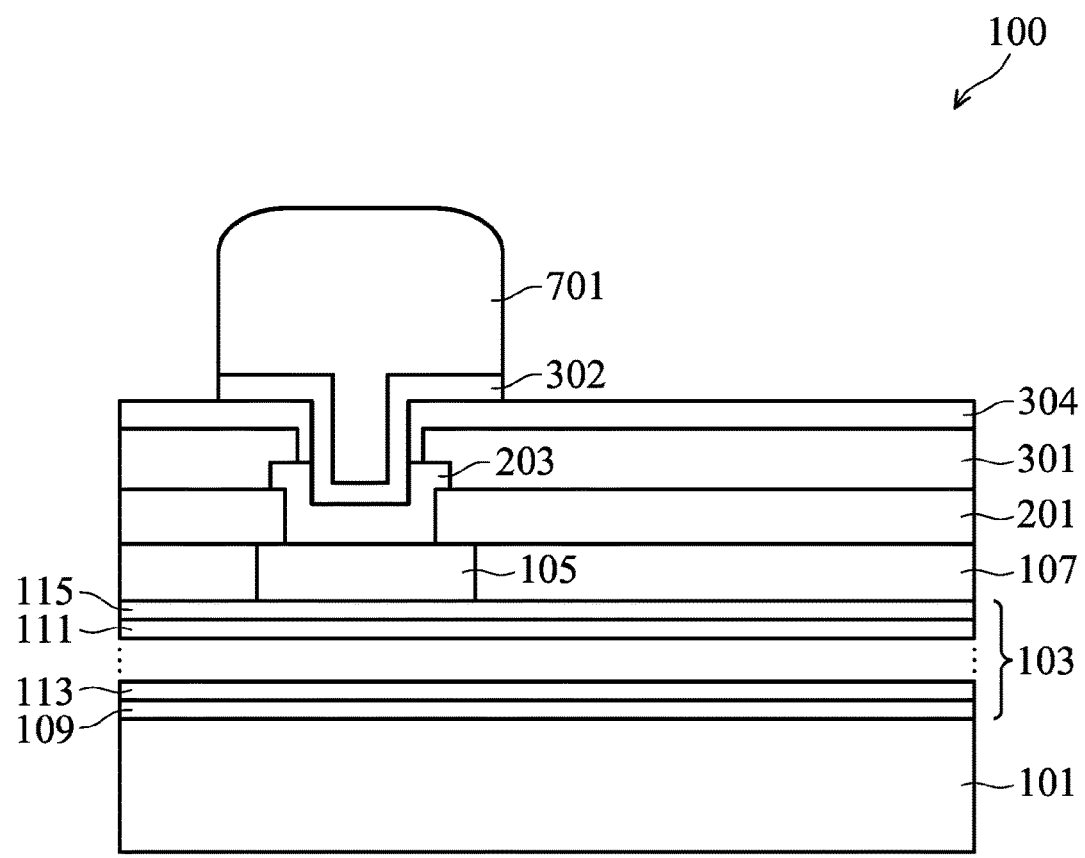
FIG. 7 illustrates the formation of a contact bump in accordance with an embodiment.
Figure 8:
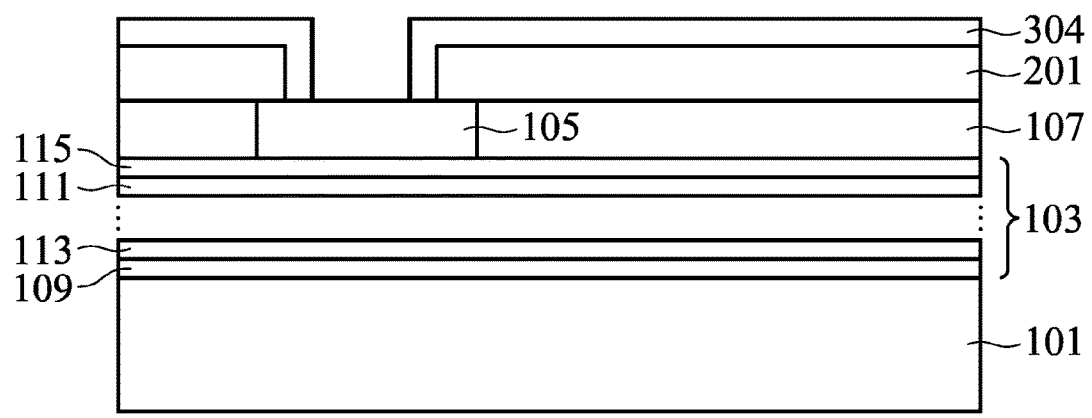
FIGS. 8-9 illustrate an embodiment in which the conductive pillar is formed in contact with the first metal contact.
Figure 9:
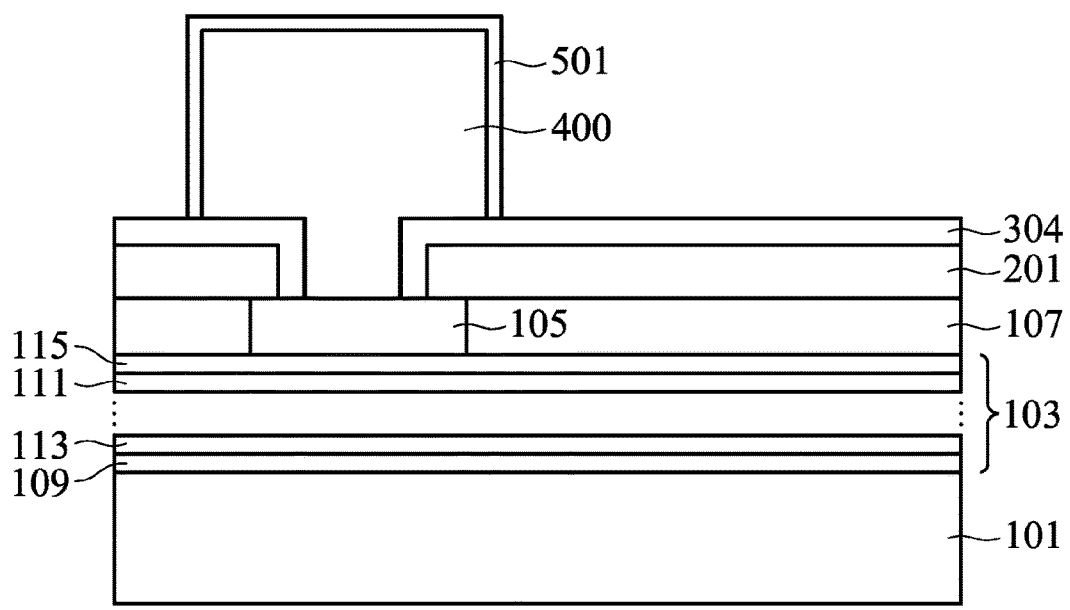

FIG. 7 illustrate another embodiment in which the conductive pillar 400 (see, e.g., FIG. 6) is replaced with a contact bump 701. In this embodiment, after the UBM 302 and the mask 303 have been formed, the contact bump 701 is formed in the opening of the mask 303. The contact bump 701 may comprise a material such as tin, or other suitable materials, such as silver, lead-free tin, or copper. In an embodiment in which the contact bump 701 is a tin solder bump, the contact bump 701 may be formed by initially forming a layer of tin through such commonly used methods such as electroplating, evaporation, printing, etc., to a thickness of about 100 pm. Once the contact bump 701 has been formed in the opening of the mask 303, the mask 303 is removed using a suitable removal process such as stripping, and the UBM 302 may be patterned as described above with respect to FIG. 5A. Once the mask 303 has been removed, a re-flow may be performed, so that the contact bump 701 forms a rounded top surface FIGS. 8-9 illustrate yet another embodiment in which the contact pad 203 (see FIGS. 2-6) is excluded and the conductive pillar 400 is formed in contact with the first metal contact 105. By forming the conductive pillar 400 in contact with the first metal contact 105, the contact pad 203 may be eliminated, thereby simplifying the overall process of manufacturing the wafer 100.

Looking initially at FIG. 8, to form the conductive pillar 400 in contact with the first metal contact 105, the first metal contact 105 and second passivation layer 201 are formed similar to the formations described above with reference to FIG. 1 and FIG. 2, with the second passivation layer 201 being patterned to form an opening that exposes a portion of the first metal contact 105. Then, instead of forming the contact pad 203, the PI coating 304 is formed over the second passivation layer 201 and in the trench to also cover the first metal contact 105.

Once formed, the PI coating 304 is removed from the bottom of the trench in order to expose an upper surface of the first metal contact 105. This removal may be performed using a suitable masking and removal process, such as a photolithographic mask and etching process. Additionally, while the removal process may optionally remove the PI coating 304 from the sidewalls of the trench, in an embodiment the PI coating 304 is not removed from the sidewalls of the trench so as to isolate the subsequently formed conductive pillar 400.

FIG. 9 illustrates the formation of the conductive pillar 400 and the protective layer 501 over the PI coating 304, with the conductive pillar 400 in contact with the first metal contact 105. The conductive pillar 400 may be formed through processes similar to the process described above with respect to FIGS. 3-5. In this embodiment, however, the conductive pillar 400 is formed in contact with the first metal contact 105 instead of the contact pad 203 as illustrated in previous FIGS. 2-6, allowing for a less resistive flow from the conductive pillar 400 to the metallization layers 103.

Figure 10:
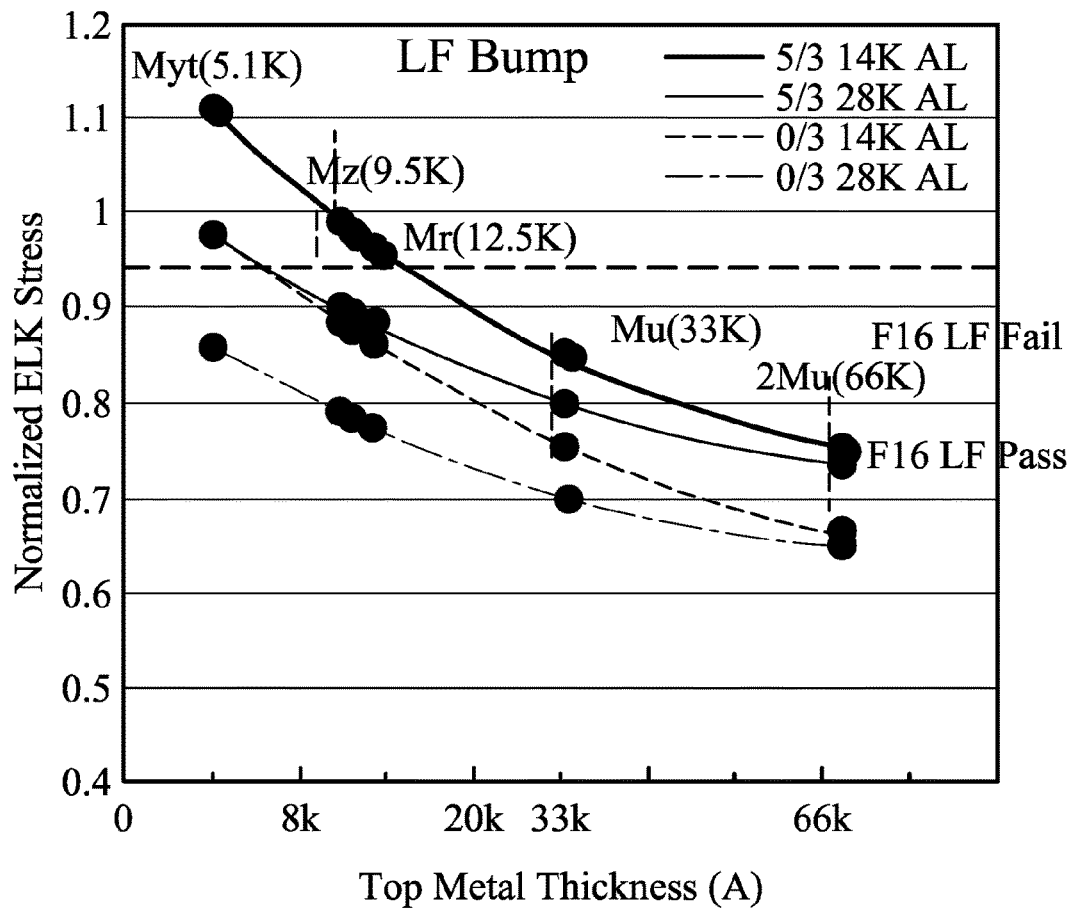
FIG. 10 illustrates the benefits associated with the range of thicknesses for the first metal contact.

FIG. 10 illustrates the unexpected benefits that may be obtained using embodiments described herein over a range of thicknesses for the first metal contact 105. As illustrated, in an embodiment in which a 5/3 µm Cu/Ni plating UBM for a lead free solder bump with an aluminum contact pad of about 14,000 Å, as the thickness of the first metal contact 105 is increased along the x-axis into the critical range described above with respect to FIG. 1, the normalized stresses on an underlying ELK dielectric layer is reduced so far that the normalized stress is below a failing point of the underlying ELK dielectric layer. Additionally, FIG. 10 also illustrates that, in an embodiment in which an aluminum contact pad about 14,000 Å thick is utilized, increasing the thickness of the top metal can reduce the normalized ELK stresses below the fail point. As such, a semiconductor die can better withstand the hazards of processing, transportation, and use with less failure and more reliability.

Although the disclosure and its advantages have been described in detail, it should be understood that various changes, substitutions and alterations can be made herein without departing from the spirit and scope of the invention as defined by the appended claims. For example, many different materials and processes may be used to form the conductive pillar. All of these materials and processes are fully intended to be included within the disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A semiconductor device comprising:
   a metal contact over a substrate, the metal contact having a thickness of at least 15,000 Å, wherein a first material is located throughout the metal contact;
   a contact pad in electrical connection with the metal contact, wherein an external sidewall of the contact pad is located directly over the metal contact, wherein the contact pad has a U-shape and has a width that is less than the metal contact;
   a first passivation layer located at least partially between the metal contact and the contact pad in a direction perpendicular to a major surface of the substrate;
   a plurality of dielectric layers located between the metal contact and the substrate, the plurality of dielectric layers comprising an extra low-k dielectric material;
   an underbump metallization in physical contact with the contact pad;

a second passivation layer located at least partially between the underbump metallization and the contact pad; and an external contact in physical contact with the underbump metallization.

2. The semiconductor device of claim 1, wherein the metal contact has a thickness of about 20,000 Å.

3. The semiconductor device of claim 1, wherein the contact pad has a thickness between about 10,000 Å and about 50,000 Å.

4. The semiconductor device of claim 1, wherein the first passivation layer comprises a first material and the second passivation layer comprises the first material.

5. The semiconductor device of claim 4, further comprising a third passivation layer adjacent to the metal contact, wherein the third passivation layer comprises the first material.

6. The semiconductor device of claim 1, further comprising a polyimide coating located on the second passivation layer.

7. The semiconductor device of claim 1, wherein the underbump metallization is a copper titanium alloy.

8. A semiconductor device comprising:
a plurality of extra low-k dielectric layers over a semiconductor substrate;
a buffer contact located over the plurality of extra low-k dielectric layers, the buffer contact being at least 15,000 Å in thickness;
a U-shaped contact in physical connection with the buffer contact, the U-shaped contact having a smaller width than the buffer contact, the U-shaped contact comprising a recess;
an underbump metallization extending into the recess; and
a conductive pillar adjacent to the underbump metallization and also extending into the recess.

9. The semiconductor device of claim 8, wherein the underbump metallization has a thickness of between about 0.1 μm and about 2 μm.

10. The semiconductor device of claim 8, wherein the conductive pillar has a width of between about 10 μm and about 200 μm.

11. The semiconductor device of claim 8, further comprising a conductive barrier layer over the conductive pillar.

12. The semiconductor device of claim 11, wherein the conductive barrier layer comprises nickel.

13. The semiconductor device of claim 8, wherein the conductive pillar has a first sidewall and the underbump metallization has a second sidewall aligned with the first sidewall.

14. A semiconductor device comprising:
a single metal material over an extra low-k dielectric layer, the single metal material having a first width and a first thickness, the first thickness being greater than 15,000 Å;
a contact pad in electrical connection with the single metal material, the contact pad having a U shape and a second width less than the first width;
a first passivation layer located over the contact pad;
a first opening through the first passivation layer and exposing the contact pad, the first opening having a first width;
a second passivation layer located over the contact pad; and
a second opening through the second passivation layer and exposing the contact pad, the second opening having a second width less than the first width.

15. The semiconductor device of claim 14, further comprising an underbump metallization extending at least partially into the second opening.

16. The semiconductor device of claim 15, an external contact in electrical connection with and physically aligned with the underbump metallization.

17. The semiconductor device of claim 16, further comprising a protective layer over the external contact.

18. The semiconductor device of claim 17, wherein the protective layer has a thickness between 500 Å and 5000 Å.

19. The semiconductor device of claim 18, wherein the protective layer has a thickness between 500 Å and 2000 Å.

20. The semiconductor device of claim 16, wherein the external contact is a copper pillar.

* * * * *